United States Patent
Smalc

(10) Patent No.: US 6,886,249 B2
(45) Date of Patent: May 3, 2005

(54) METHOD FOR MAKING FINNED HEAT SINK ASSEMBLIES

(75) Inventor: Martin D. Smalc, Parma, OH (US)

(73) Assignee: Advanced Energy Technology Inc., Parma, OH (US)

( * ) Notice: Subject to any disclaimer, the term of this patent is extended or adjusted under 35 U.S.C. 154(b) by 198 days.

(21) Appl. No.: 10/256,828

(22) Filed: Sep. 27, 2002

(65) Prior Publication Data

US 2003/0019104 A1 Jan. 30, 2003

Related U.S. Application Data

(62) Division of application No. 09/847,717, filed on May 2, 2001.

(51) Int. Cl.[7] ................................. B23P 15/26
(52) U.S. Cl. ............... 29/890.03; 29/890.043; 165/80.3; 165/185
(58) Field of Search .............. 29/890.03, 890.043, 29/428, 458; 165/80.3, 185, 164, 165, 179, 181, 151; 174/163; 257/722; 361/704

(56) References Cited

U.S. PATENT DOCUMENTS

| 3,404,061 A | | 10/1968 | Shane et al. ................. 161/125 |
| 3,825,064 A | * | 7/1974 | Inoue ......................... 165/179 |
| 3,873,805 A | * | 3/1975 | Inoue ......................... 219/149 |

(Continued)

FOREIGN PATENT DOCUMENTS

| JP | 62285974 | 12/1987 |
| JP | 2160891 | 6/1990 |

OTHER PUBLICATIONS

International Publication No. WO 00/54953, International Publication Date Sep. 21, 2000, International Application No. PCT/US00/06918, Filed Mar. 15, 2000, Inventor: T.P. Hayward, Title: Graphite Foam Material and Method of Making Same.

English Language Abstract of German Patent DE3934784–A1.

U.S. Appl. No. 09/513,001, filed Feb. 25, 2000 entitled "Thermal Management System" to Tzeng. (not prior art).

U.S. Appl. No. 09/595,754, filed Jun. 16, 2000 entitled "Graphite Based Heat Sink" to Norley et al. (not prior art).

Primary Examiner—Irene Cuda-Rosenbaum
(74) Attorney, Agent, or Firm—Waddey & Patterson; James R. Cartiglia

(57) ABSTRACT

A construction is provided for a finned heat sink constructed from a plurality of components separately formed from graphite materials. The components include a base and a plurality of fins. In one embodiment, the base is constructed from a first graphite material, and a plurality of elongated fins are constructed from a second graphite material, which may be the same material as the first graphite material. The fins each extend at least partially into the base, and have a length extending away from the base parallel to each other. The graphite material of the fins includes graphene layers aligned in planes parallel to the length of the fins. Two constructions are provided for the base. In one construction the base includes graphene layers aligned in planes parallel to the length of the fins. In another construction the base includes graphene layers aligned in planes perpendicular to the length of the fins.

6 Claims, 7 Drawing Sheets

U.S. PATENT DOCUMENTS

| | | | |
|---|---|---|---|
| 4,471,837 A | 9/1984 | Larson | 165/185 |
| 4,704,231 A | 11/1987 | Chung | 252/511 |
| 4,715,438 A | 12/1987 | Gabuzda et al. | 165/185 |
| 4,733,293 A | 3/1988 | Gabuzda | 357/81 |
| 4,746,479 A * | 5/1988 | Hanaki et al. | 264/629 |
| 4,753,290 A | 6/1988 | Gabuzda | 165/185 |
| 4,851,965 A | 7/1989 | Gabuzda et al. | 361/383 |
| 4,878,152 A | 10/1989 | Sauzade et al. | 361/386 |
| 5,270,902 A | 12/1993 | Bellar et al. | 361/718 |
| 5,366,688 A | 11/1994 | Terpstra et al. | 419/36 |
| 5,390,734 A * | 2/1995 | Voorhes et al. | 165/185 |
| 5,523,260 A | 6/1996 | Missele | 437/209 |
| 5,542,471 A | 8/1996 | Dickinson | 165/170 |
| 5,582,781 A | 12/1996 | Hayward | 264/28 |
| 5,769,158 A * | 6/1998 | Yao | 165/185 |
| 5,882,570 A | 3/1999 | Hayward | 264/328 |
| 5,902,762 A | 5/1999 | Mercuri et al. | 501/99 |
| 6,027,807 A | 2/2000 | Inoue et al. | 428/408 |
| 6,075,701 A | 6/2000 | Ali et al. | 361/704 |
| 6,085,830 A * | 7/2000 | Mashiko et al. | 165/80.3 |
| 6,208,513 B1 | 3/2001 | Fitch et al. | 361/704 |
| 6,503,626 B1 * | 1/2003 | Norley et al. | 428/408 |
| 2001/0045270 A1 * | 11/2001 | Bhatti et al. | 165/80.3 |
| 2003/0019104 A1 * | 1/2003 | Smalc | 29/890.03 |

\* cited by examiner

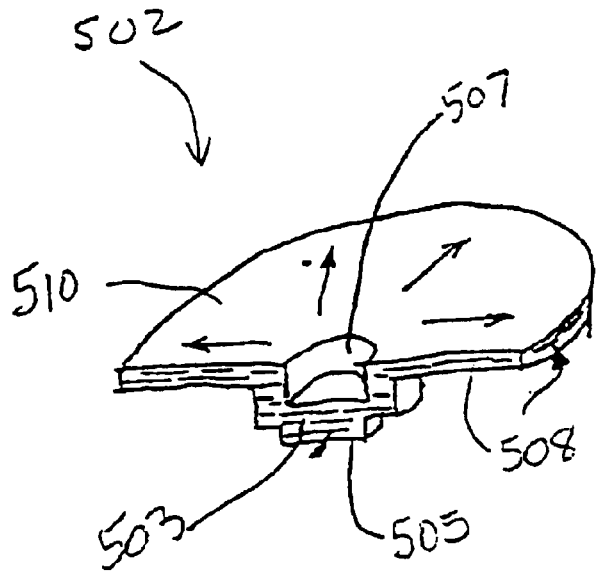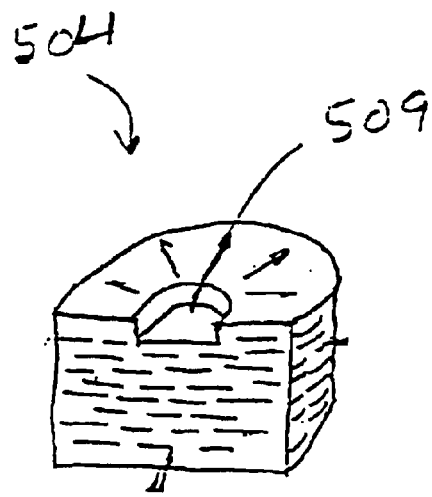
FIG. 10  FIG. 11
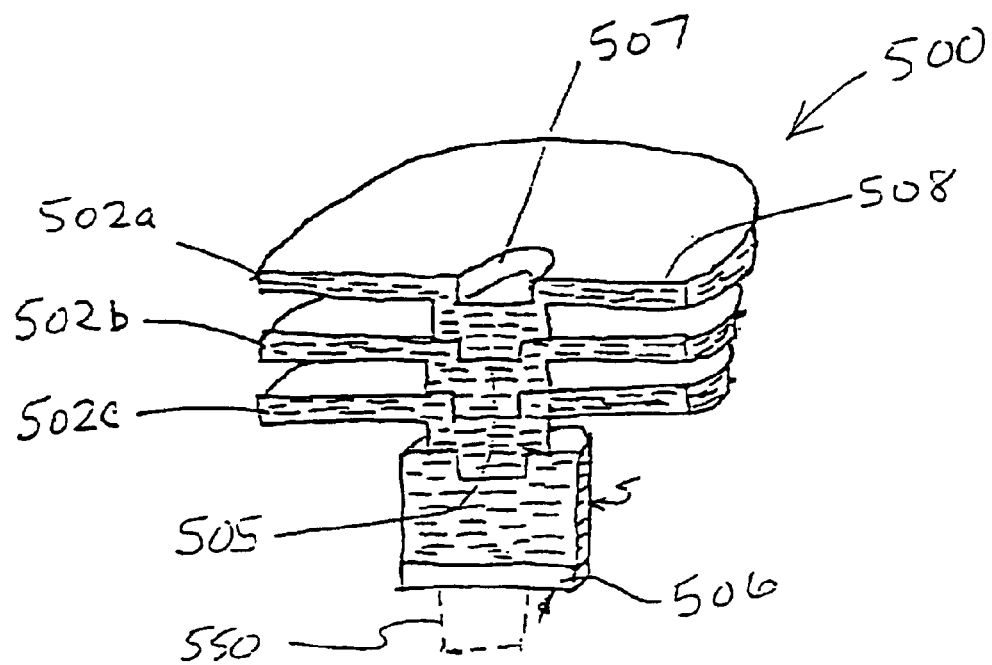
FIG. 12

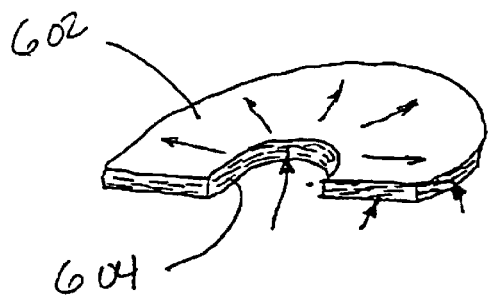
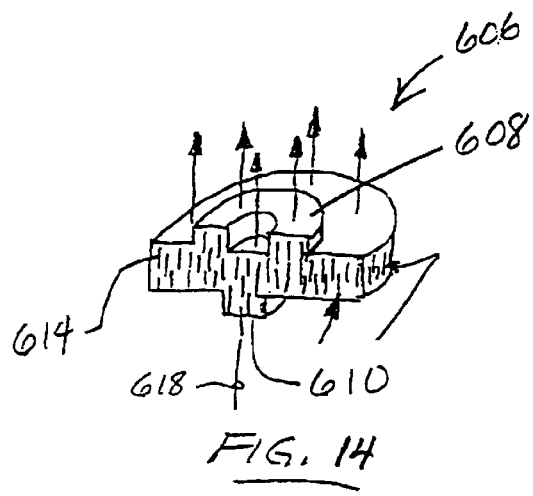
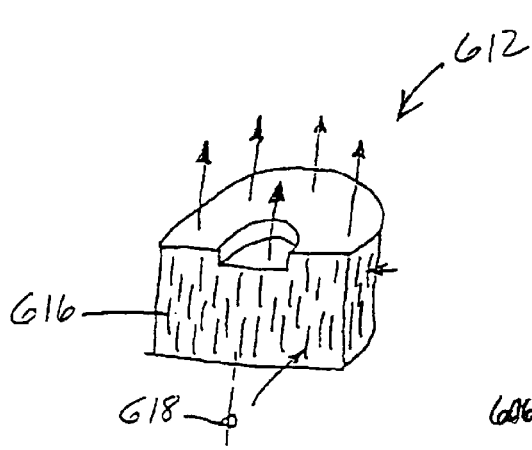
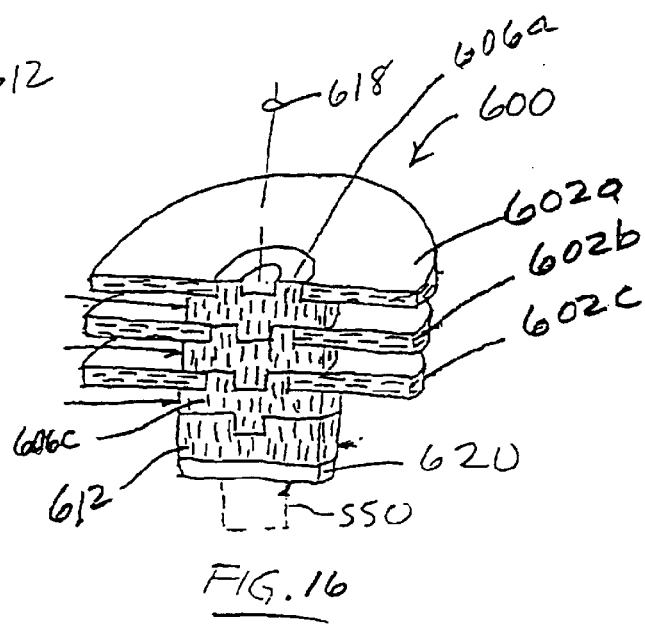

METHOD FOR MAKING FINNED HEAT SINK ASSEMBLIES

This is a divisional application of co-pending application Ser. No. 09/847,717 entitled "Finned Heat Sink", filed May 2, 2001.

Be it known that I, Martin D. Smalc, a citizen of the United States, residing at, 5608 Ely Vista Dr., Parma, Ohio 44129, has invented a new and useful "FINNED HEAT SINK ASSEMBLIES."

BACKGROUND OF THE INVENTION

1. Technical Field

The present invention relates to a heat sink capable of managing the heat from a heat source like an electronic component. More particularly, the present invention relates to a graphite-based heat sink assembly effective for dissipating the heat generated by an electronic component, wherein the heat sink assembly is constructed by bonding together a plurality of individually formed graphite components, including a base and a plurality of fins.

2. Background of the Art

With the development of more and more sophisticated electronic components, including those capable of increasing processing speeds and higher frequencies, having smaller size and more complicated power requirements, and exhibiting other technological advances, such as microprocessors and integrated circuits in electronic and electrical components and systems as well as in other devices such as high power optical devices, relatively extreme temperatures can be generated. However, microprocessors, integrated circuits and other sophisticated electronic components typically operate efficiently only under a certain range of threshold temperatures. The excessive heat generated during operation of these components can not only harm their own performance, but can also degrade the performance and reliability of the overall system and can even cause system failure. The increasingly wide range of environmental conditions, including temperature extremes, in which electronic systems are expected to operate, exacerbates the negative effects of excessive heat.

With the increased need for heat dissipation from microelectronic devices, thermal management becomes an increasingly important element of the design of electronic products. Both performance reliability and life expectancy of electronic equipment are inversely related to the component temperature of the equipment. For instance, a reduction in the operating temperature of a device such as a typical silicon semiconductor can correspond to an exponential increase in the reliability and life expectancy of the device. Therefore, to maximize the life-span and reliability of a component, controlling the device operating temperature within the limits set by the designers is of paramount importance.

Heat sinks are components that facilitate heat dissipation from the surface of a heat source, such as a heat-generating electronic component, to a cooler environment, usually air. In many typical situations, heat transfer between the solid surface of the component and the air is the least efficient within the system, and the solid-air interface thus represents the greatest barrier for heat dissipation. A heat sink seeks to increase the heat transfer efficiency between the components and the ambient air primarily by increasing the surface area that is in direct contact with the air. This allows more heat to be dissipated and thus lowers the device operating temperature. The primary purpose of a heat sink is to help maintain the device temperature below the maximum allowable temperature specified by its designer/manufacturer.

Typically, heat sinks are formed of a metal, especially copper or aluminum, due to the ability of metals like copper to readily absorb heat and transfer it about its entire structure. In many applications, copper heat sinks are formed with fins or other structures to increase the surface area of the heat sink, with air being forced across or through the fins (such as by a fan) to effect heat dissipation from the electronic component, through the copper heat sink and then to the air.

Limitations exist, however, with the use of metallic heat sinks. One limitation relates to the relative isotropy of a metal—that is, the tendency of a metallic structure to distribute heat relatively evenly about the structure. The isotropy of a metal means that heat transmitted to a metallic heat sink becomes distributed about the structure rather than being directed to the fins where most efficient transfer to the air occurs. This can reduce the efficiency of heat dissipation using a metallic (e.g., copper) heat sink. Moreover, this relative isotropy is not readily controlled or varied, and provides no opportunity for preferentially directing heat.

In addition, the use of copper or aluminum heat sinks can present a problem because of the weight of the metal, particularly when the heating area is significantly smaller than that of the heat sink. For instance, pure copper weighs 8.96 grams per cubic centimeter (g/cc) and pure aluminum weighs 2.70 g/cc (compare with graphite articles, which typically weigh less than about 1.8 g/cc). In many applications, several heat sinks need to be arrayed on, e.g., a circuit board to dissipate heat from a variety of components on the board. If metallic heat sinks are employed, the sheer weight of the metal on the board can increase the chances of the board cracking or of other equally undesirable effects, and increases the weight of the component itself.

What is desired, therefore, is a heat sink system effective for dissipating heat from a heat source such as an electronic component. The heat sink system should advantageously be relatively anisotropic, as compared to a metal like copper or aluminum and exhibit a relatively high ratio of thermal conductivity to weight. One group of materials suitable for use in heat sinks are those materials known as graphites.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. Highly ordered graphites consist of crystallites of considerable size: the crystallites being highly aligned or oriented with respect to each other and having well ordered carbon layers. In other words, highly ordered graphites have a high degree of preferred crystallite orientation. It should be noted that graphites possess anisotropic structures and thus exhibit or possess many properties that are highly directional e.g. thermal and electrical conductivity and fluid diffusion.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal and electrical conductivity and fluid diffusion, comparable to the natural graphite starting material due to orientation of the expanded graphite particles and graphite layers substantially parallel to the opposed faces of the sheet resulting from very high compression, e.g. roll pressing. Sheet material thus produced has excellent flexibility, good strength and a very high degree of orientation.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.04 g/cc to about 2.0 g/cc. The flexible graphite sheet material exhibits an appreciable degree of anisotropy due to the alignment of graphite particles parallel to the major opposed, parallel surfaces of the sheet, with the degree of anisotropy increasing upon roll pressing of the sheet material to increased density. In roll pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal, electrical and fluid diffusion properties of the sheet are very different, by orders of magnitude, for the "c" and "a" directions.

SUMMARY OF THE INVENTION

The present invention provides a heat sink assembly, and methods of constructing the same, wherein the heat sink assembly is constructed by first separately forming a plurality of components, such as a base and fins, from graphite materials. Then the components are assembled together and bonded together to create the heat sink assembly In one embodiment the heat sink assembly includes a base constructed from a graphite material. It includes a plurality of elongated fins, each fin extending at least partially into the base. The fins each have a length extending away from the base parallel to each other. Each fin is constructed of a graphite material including graphene layers primarily aligned in planes parallel to the length of the fins.

The fins are preferably formed by rolling down and compacting an anisotropic flexible graphite sheet between shaped rollers to align the graphene layers, and to form the fins from the sheet of material.

The base may be constructed in two alternate ways. In a first construction, the base includes a plurality of stacked base pieces having complementary recesses formed therein, so that the recesses of two adjacent stacked base pieces are aligned to define openings through the base. Each opening is of a size and shape to closely receive one of the fins therein. In this embodiment the graphite layers of the base are aligned primarily in planes parallel to the length of the fins.

In a second construction, the base is formed by die pressing a graphite and resin powder to form the base about end portions of the fins. In this embodiment the graphite layers of the base are aligned primarily in planes perpendicular to the length of the fins.

In another embodiment the heat sink assembly may be a radially finned heat sink assembly.

It is an object of the present invention is to provide a heat sink system exhibiting a relatively high degree of anisotropy.

Yet another object of the present invention is to provide a heat sink system having a relatively high ratio of thermal conductivity to weight.

Still another object of the present invention is to provide a heat sink system that can be fabricated so as to locate the heat dissipation surfaces thereof so as to control and/or maximize the dissipation of heat from the heat source.

Another object is to provide a heat sink assembly constructed from individually formed graphite components, so that each component of the assembly may be designed to increase the efficiency of heat transfer through the heat sink assembly.

Yet another object is to provide an axial finned heat sink having the graphite particles in the fins aligned with the length of the fins.

Still another object is to provide an economical construction for an axial finned heat sink constructed of resin impregnated graphite material.

Other and further objects, features, and advantages will be readily apparent to those skilled in the art, upon a reading of the following disclosure when taken in conjunction with the accompanying drawings.

BRIEF DESCRIPTION OF THE DRAWINGS

FIG. 2 shows an unprocessed sheet moving through a first set of shaped rollers, resulting in a partial formation of the fins.

FIG. 3 shows a late stage of the process, where the sheet moves through the final set of shaped rollers.

FIG. 4 illustrates the cutting of the fins to length, and the separation of the fins.

FIG. 10 is a sectioned perspective view of a radial fin member with an integral core portion die pressed from a sheet of graphite material.

FIG. 11 is a sectioned perspective view of a base die pressed from a sheet of graphite material.

FIG. 12 is a sectioned perspective view of a first embodiment of a radial finned heat sink constructed with the components of FIGS. 10 and 11.

FIG. 13 is a sectioned perspective view of a fin member with central opening die pressed from a sheet of graphite material.

FIG. 14 is a sectioned perspective view of a separate core member formed by isostatically pressing a graphite powder to form a core member having its graphite layers primarily aligned in planes parallel to a central axis of the core.

FIG. 15 is a sectioned perspective view of a base formed by isostatically pressing a graphite powder to form a base having its graphite layers primarily aligned in planes parallel to a central axis of the base.

FIG. 16 is a sectioned perspective view of a second embodiment of a radial finned heat sink constructed from the components of FIGS. 13–15.

DESCRIPTION OF THE PREFERRED EMBODIMENTS

Figure 1:
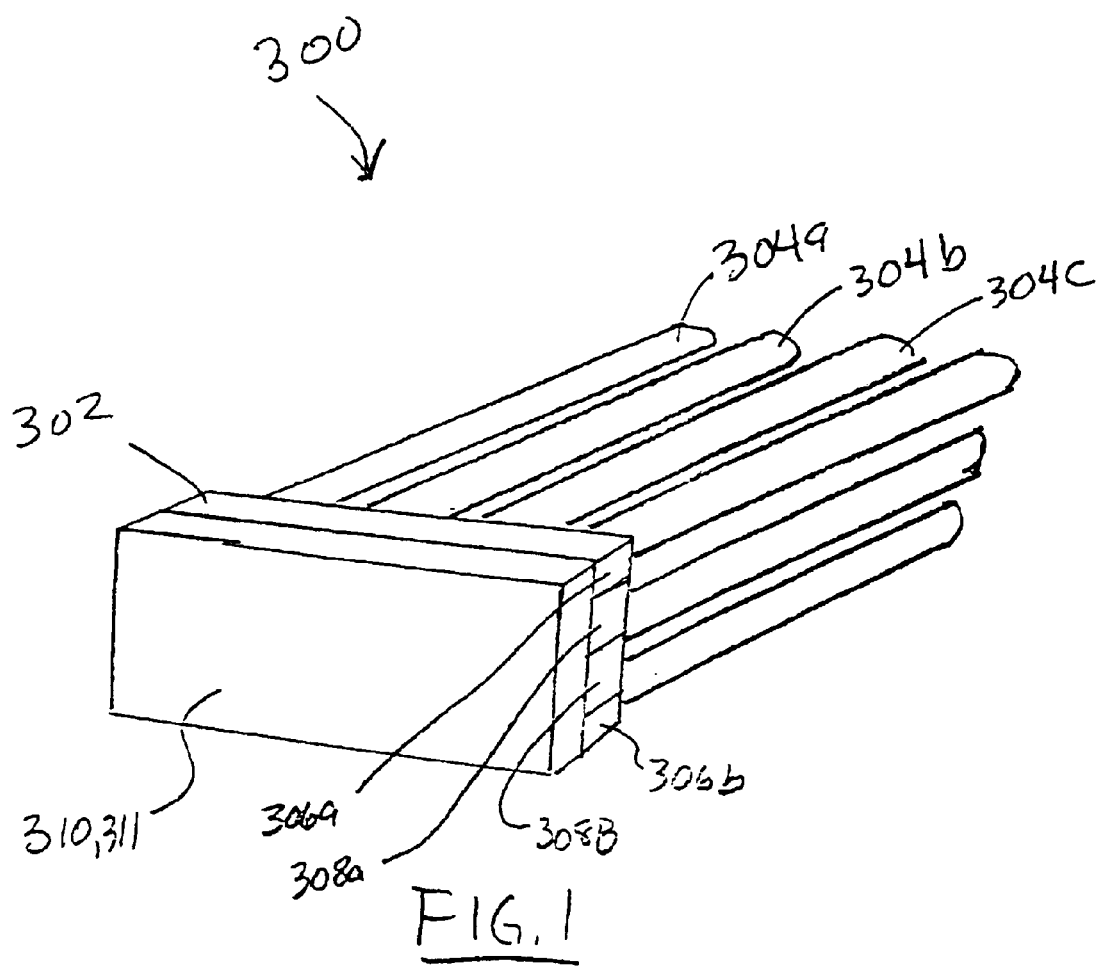
FIG. 1 is a perspective view of an axially finned heat sink.

Thus, although there have been described particular embodiments of the present invention of a new and useful FINNED HEAT SINK ASSEMBLIES, it is not intended that such references be construed as limitations upon the scope of this invention except as set forth in the following claims.

Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes and provided with small transverse openings by deforming mechanical impact.

Graphite starting materials suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as carbons prepared by chemical vapor deposition and the like. Natural graphite is most preferred.

The graphite starting materials used in the present invention may contain non-carbon components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has an ash content of less than twenty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 150 pph and more typically about 50 to about 120 pph. After the flakes are intercalated, any excess solution is drained from the flakes and the flakes are water-washed. Alternatively, the quantity of the intercalation solution may be limited to between about 10 and about 50 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1, 10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_nCOOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representa tive of dicarboxylic acids are aliphatic dicarboxylic acids having 2–12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 20 hours, with shorter heating periods, e.g., at least about 10 minutes, for higher temperatures in the above-noted range. Times of one half hour or less, e.g., on the order of 10 to 25 minutes, can be employed at the higher temperatures.

The thus treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets that, unlike the original graphite flakes, can be formed and cut into various shapes and provided with small transverse openings by deforming mechanical impact as hereinafter described.

Flexible graphite sheet and foil are coherent, with good handling strength, and are suitably compressed, e.g. by roll-pressing, to a thickness of about 0.075 mm to 3.75 mm and a typical density of about 0.1 to 1.5 grams per cubic centimeter (g/cc). From about 1.5–30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

The flexible graphite sheet can also, at times, be advantageously treated with resin and the absorbed resin, after curing, enhances the moisture resistance and handling strength, i.e. stiffness, of the flexible graphite sheet as well as "fixing" the morphology of the sheet. Suitable resin content is preferably at least about 5% by weight, more preferably about 10 to 35% by weight, and suitably up to about 60% by weight. Resins found especially useful in the practice of the present invention include acrylic-, epoxy- and phenolic-based resin systems, or mixtures thereof. Most preferably, however, resin impregnation is minimized, nor does the flexible graphite sheet contain additives such as ceramic fiber particles, in order to optimize thermal conductivity.

As will be described below, some of the components of the heat sink apparatus of the present invention may be formed by die pressing the same from flexible graphite sheet, which may be resin impregnated flexible graphite sheet. Other components, however, maybe be better formed by grinding up or comminuting the flexible graphite sheet into a powder, and then pressing that powder into a molded shape.

Once the flexible graphite sheet is prepared, it can then be comminuted by known processes or devices, such as a jet mill, air mill, blender, etc. to produce particles. Preferably, a majority of the particles have a diameter such that they will pass through 20 U.S. mesh; more preferably a major portion (greater than about 20%, most preferably greater than about 50%) will not pass through 80 U.S. mesh. It may be desirable to cool the flexible graphite sheet when it is resin-impregnated as it is being comminuted to avoid heat damage to the resin system during the comminution process.

The size of the comminuted particles should be chosen so as to balance machinability and formability of the graphite article with the thermal characteristics desired. Thus, smaller particles will result in a graphite article which is easier to machine and/or form, whereas larger particles will result in a graphite article having higher anisotropy, and, therefore, greater in-plane thermal conductivity. Accordingly, the artisan should in most instances employ the largest particles which permit forming and machining to the degree necessary.

Once the flexible graphite sheet is comminuted, it is compressed into the desired shape and then cured (when resin impregnated) in the preferred embodiment. Alternatively, the sheet can be cured prior to being comminuted, although post-comminution cure is preferred. Compression can be by die pressing, roll pressing, isostatic molding or other like compression processes. Interestingly, the isotropy/anisotropy of the final article can be varied by the compression (or molding) pressure, the particular molding process utilized and the size of the particles. For instance, die pressing will result in greater alignment of the graphene layers and, thus, a more anisotropic final product, than isostatic molding. Likewise, an increase in molding pressure will also result in an increase in anisotropy. Thus, adjustment of molding process and molding pressure, as well as selection of comminuted particle size, can lead to controllable variations in isotropy/anisotropy. This can be used to control heat conduction of heat sink 10, to most efficiently dissipate heat from electronic component 100. In other words, control of isotropy/anisotropy can be used to direct heat from electronic component 100 to the surfaces of heat sink 10 where heat dissipation is best/most desired. Typical molding pressures employed range from under about 7 Mega Pascals (MPa) to at least about 240 MPa.

Heat Sinks Assembled From Components

In one aspect, the present invention is broadly directed to heat sink assemblies that are constructed from individually formed graphite components. Those components will typically include a base and a plurality of fins, and may include other components such as the core connectors shown in the radial finned heat sink embodiment shown in FIGS. 10–16. Two basic examples of such heat sink assemblies are disclosed herein, namely the axial finned assemblies of FIGS. 1–9 and the radial finned heat sink assemblies of FIGS. 10–16. Other constructions are also possible.

These heat sink assemblies can be constructed from any of the forms of graphite materials disclosed above, including but not limited to unimpregnated graphite sheet, resin impregnated graphite sheet, and powdered forms of each.

Construction of the assemblies from separately engineered graphite components allows the heat transfer characteristics of each part of the assembly to be maximized as compared to a similarly shaped integrally molded graphite heat sink. The engineered components will be preferably be engineered so that the graphene layers are primarily aligned in planes oriented parallel to a direction of a heat transfer path through the heat sink.

Axial Finned Heat Sink Construction

Axial finned heat sinks are used to cool a heat source, such as an electronic component like a chip assembly. Heat generated by the heat source is drawn into the heat sink by conduction and then carried out of the heat sink by convection through the fins. The fins are perpendicular to the surface of the chip assembly. The cross section of the fins varies; circular cross-section fins are used in some applications and airfoil shaped fins are used in others; both can be referred to as rounded cross-section shapes. The type, number and configuration of the fins vary depending on the cooling requirements. These heat sinks are typically made from aluminum alloys. These alloys have a typical density of about 2.7 g/cm3 and exhibit a thermal conductivity that is isotropic and is as high as about 221 W/m° C. Significant machining is required to manufacture these heat sinks and adds to their cost.

The axial finned heat sink is mounted above the heat source and is actually attached to the heat source. If mechanical vibrations occur, the mass of the heat sink can cause strains in the heat source that can lead to failures. Thus reducing the mass of the heat sink will improve the reliability of the assembly.

Figure 7:
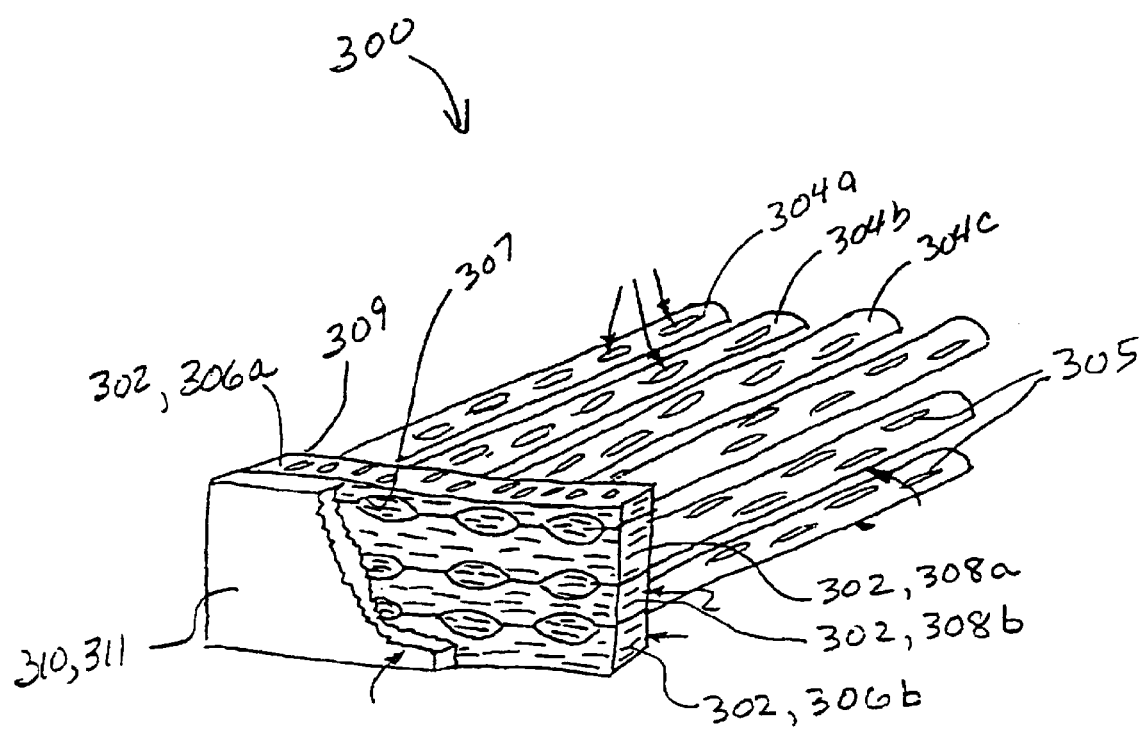
FIG. 7 is a perspective partially sectioned view of the assembled axial finned heat sink resulting from the components shown in FIGS. 2–6.
Figure 9:
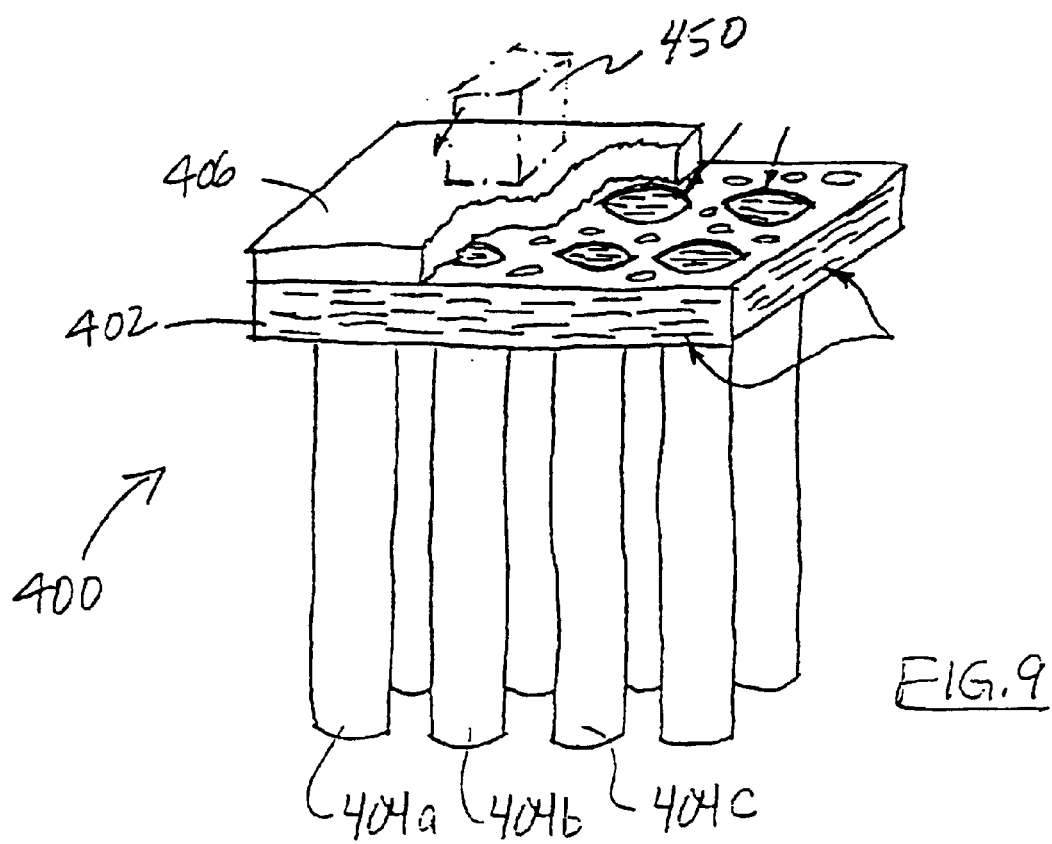
FIG. 9 is a perspective view of the axial finned heat sink resulting from the process of FIG. 8.

An axial finned heat sink can be made from flexible graphite materials by two different methods. In both methods, individual fins are made from rolled sheet and are assembled into a base. In the first method, the base is made from multiple layers of rolled material. In the second method, the base is made from a die pressed powder. An axial finned heat sink made by the first method is shown in FIGS. 1 and 7 and is identified by the numeral 300. An axial finned heat sink made by the second method is shown in FIG. 9 and is identified by the numeral 400.

The heat sink 300 of FIG. 7 includes a base 302 and a plurality of elongated fins 304a, 304b, 304c, etc. The base 302 is made up of two end pieces 306a and 306b, and two intermediate pieces 308a and 308b. A thermal interface 310 is formed from a sheet of anisotropic flexible graphite sheet material, which is preferably unimpregnated.

Figure 2:
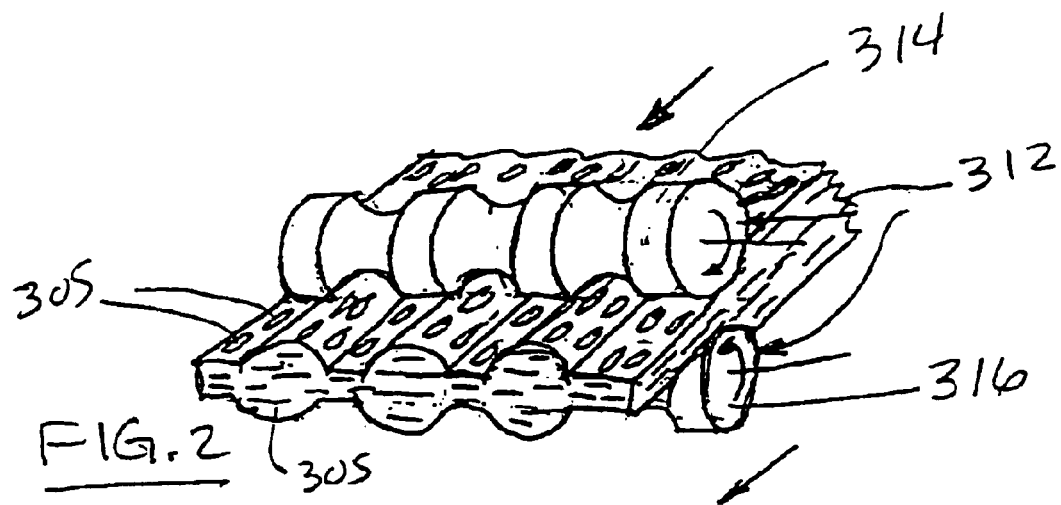
FIGS. 2–4 comprise a sequential series of schematic illustrations of the rolling of a graphite sheet material through a series of sequential shaped rollers to form the axial fins of the present invention.

The individual fins 304 are made by rolling down and compacting a sheet 312 of flexible graphite material, which may be resin-impregnated, between a first pair of shaped rollers 314 and 316, as shown in FIG. 2. As the material moves between successive pairs of rollers, the fin shape is generated and the material between individual fins is gradually reduced until the fins can be easily separated from one another.

Figure 3:
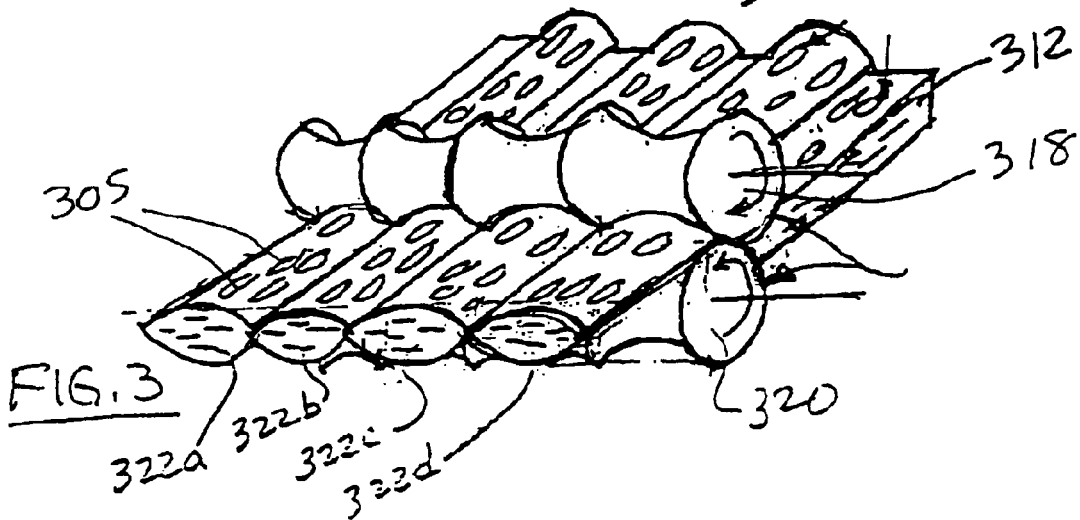
Figure 4:
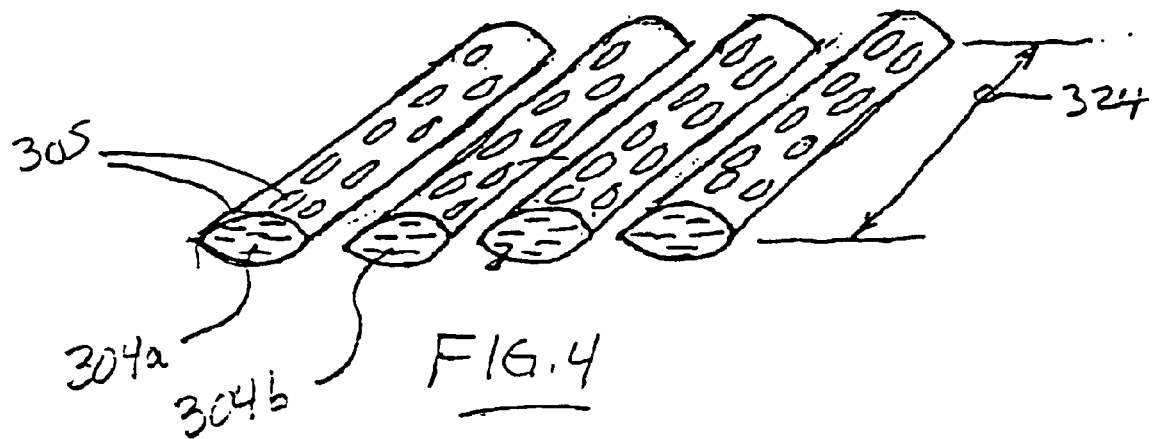

FIG. 3 shows a later stage in the fin rolling process wherein the sheet 312 is passing through another stage of rollers 318 and 320. As seen in FIG. 3, the successive staged rolling of sheet 312 has created a plurality of parallel elongated fin stock members 322a, 322b, 322c, etc. A portion of the rolled sheet 312 having a length 324 corresponding to the desired length of the fins 304 is then cut off from rolled sheet 312, and the fin stock members are separated to create fins 304a, 304b, etc. as shown in FIG. 4. The fins shown in FIG. 4 have an airfoil shape cross-section, which can generally be referred to as a rounded cross-section. Other rounded cross-section shapes, such as a circular cross-section could also be formed.

The rolling process aligns the graphene layers in planes parallel to the long axis of the fin. The thermal conductivity along the long axis of the fin will be substantially greater than across the thickness of the fin. This will efficiently spread heat along the long axis of the fin.

Figure 5:
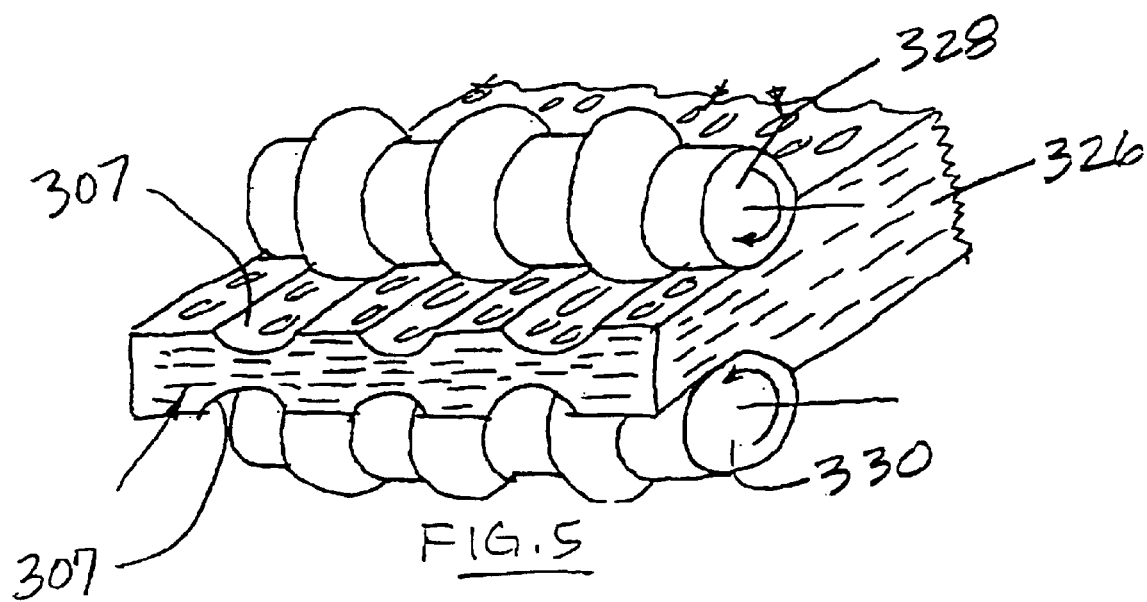
FIG. 5 schematically illustrates the forming of the intermediate base pieces by passing a sheet of graphite material through shaped rollers.

In the first method of forming the base, the base 302 shown in FIG. 7 is made from multiple layers of rolled material. In this method the base includes two different types of pieces, end pieces 306 and intermediate pieces 308. Intermediate pieces 308 are made by rolling down and compacting sheet 326 between shaped rollers 328 and 330, as shown in FIG. 5. The specific shape of the rollers 328 and 330 is dependent upon the size and shape of the fins used and their spacing. Thickness of the intermediate piece is also dependent on fin spacing. Intermediate pieces are rolled in continuous sheets and cut lengthwise to the desired thickness. The intermediate pieces are then cut to the desired width, depending on the number of fins required. The rolling process aligns the graphite layers in planes parallel to the direction of the fins that will be installed.

Figure 6:
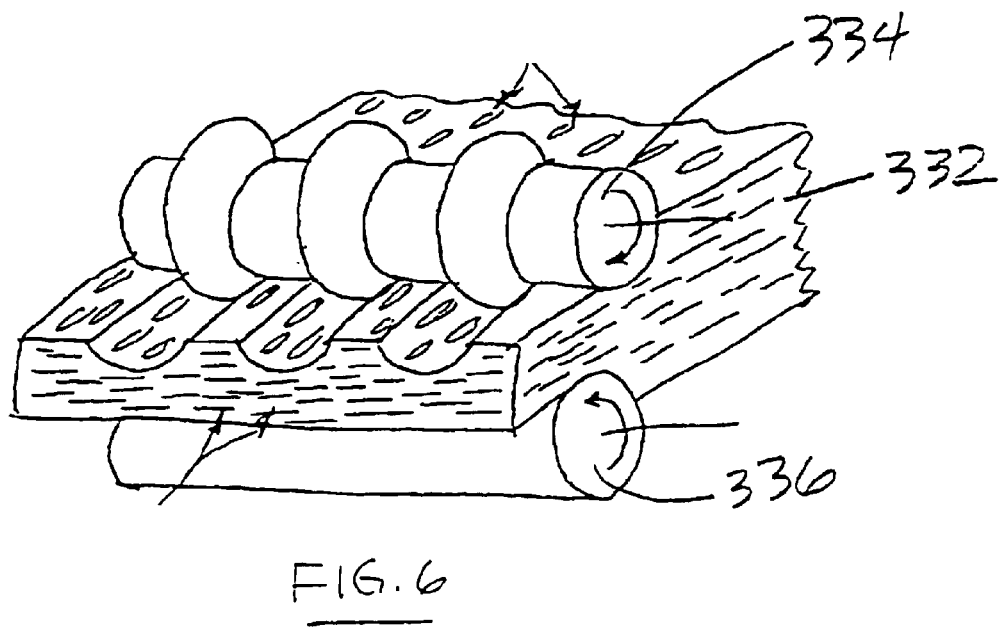
FIG. 6 schematically illustrates the forming of the end base pieces by passing a sheet of graphite material through shaped rollers.

End pieces 306 are also made by rolling down and compacting sheet 332 between shaped rollers 334 and 336, as shown in FIG. 6. In this case roller 336 is flat while the opposing roller 334 has the same shape as the rollers 328 and 330 used for the matching intermediate pieces. End pieces are rolled in continuous sheets and cut lengthwise to the desired thickness. The end pieces are then cut to the desired width, depending on the number of fins required. The rolling process aligns the graphene layers in planes parallel to the direction of the fins that will be installed.

The complete heat sink assembly 300 is made by stacking end pieces 306 and intermediate pieces 308 together, while trapping the fins 304 between them, as shown in FIG. 7. A piece of graphite sheet 310, which preferably is unimpregnated, is placed on the end of the base assembly to act as a thermal interface to the chip itself. If the components of the heat sink assemble are not resin impregnated, a thin layer of a resin, such as phenolic, acrylic or epoxy-based resin system can be interposed between the components. The complete assembly is clamped together and the resin is cured. The individual end pieces 306, intermediate pieces 308, fins 304 and thermal interface 310 then become bonded together.

Because the individual fins 304 are rolled, the graphene layers that make them up will lie together in planes parallel to the surface of the fin.

The apparatus of FIG. 7 can generally be described as a heat sink apparatus 300 for an electronic component, comprising a base 302 constructed from a first graphite material, and a plurality of elongated fins 304a, 304b, etc., each fin 304 extending at least partially into the base 302, the plurality of fins 304 each having a length extending away from the base 302 parallel to each other, each fin 304 being constructed of a second graphite material including graphite layers 305 aligned in planes parallel to the length of the fins 304. The first and second graphite materials may both be the same material, e.g. a flexible graphite sheet, which may be resin impregnated.

As shown in FIGS. 2–4, the fins 304 are formed by rolling down and compacting the anisotropic flexible graphite sheet 312 between shaped rollers 314,316 and 318,320 to align the graphene layers 305 in planes parallel to the length of the fins.

The base 302 can be described as including a plurality of stacked base pieces 306a, 308a, 308b and 306b, having complementary recesses 307 formed therein, so that the recesses 307 of two adjacent stacked base pieces are aligned to define openings through the base, each opening being shaped to closely receive one of the fins therein. The base pieces 306,308 and the fins 304 are bonded together by clamping the base pieces and fins together and then curing the base pieces and fins to create a bond therebetween. If the components of the graphite article are not resin impregnated, a thin layer of a resin, such as phenolic, acrylic or epoxy-based resin system can be interposed between the components.

The base 302 can be described as including first and second opposite planar sides 309 and 311, the fins extending from the first planar side 309 of the base with the length of the fins 304 oriented perpendicular to the first planar side 309, and the thermal interface 310 formed from a sheet of anisotropic flexible graphite material spanning the base pieces and defining the second planar side 311 of the base. Preferably, the base pieces are constructed from a resin impregnated graphite sheet material, and the thermal interface is constructed from an unimpregnated graphite sheet material.

Figure 8:
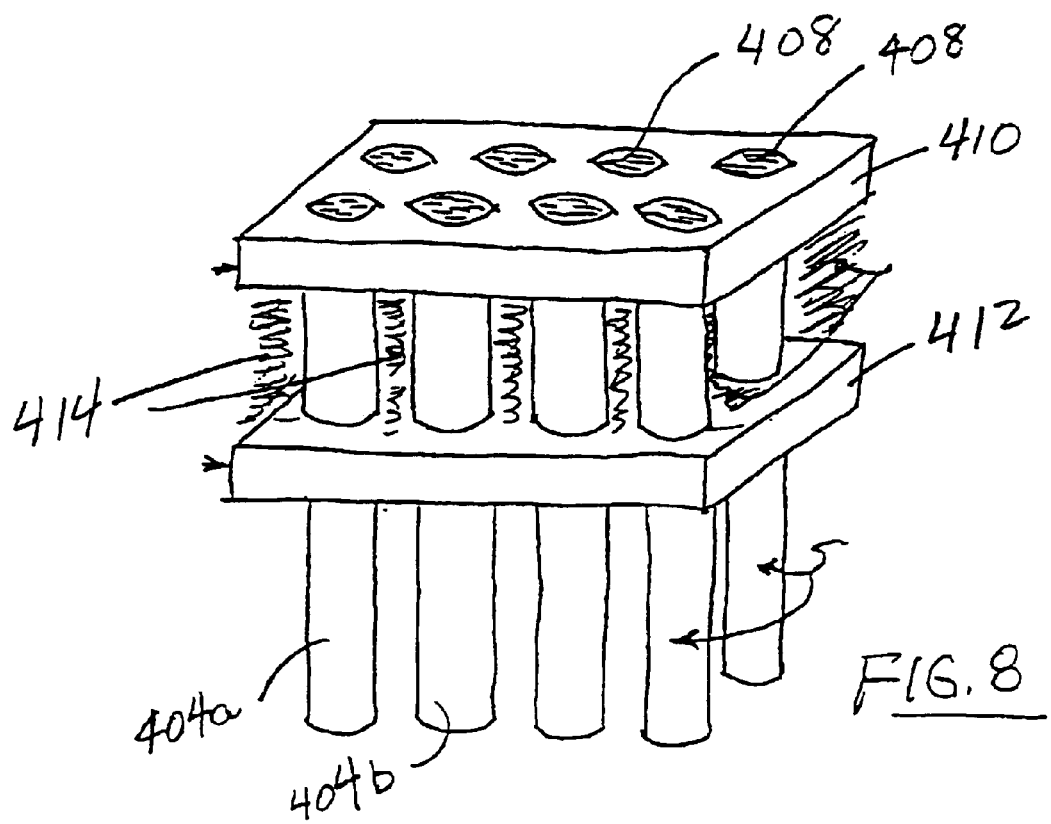
FIG. 8 illustrates a second manner of constructing a base by pressure molding the same around end portions of the axial fins.

The Embodiment of FIGS. 8 and 9

The heat sink 400 of FIG. 9 includes a base 402, a plurality of elongated fins 404a, 404b, 404c, etc., and a thermal interface 406.

In this second embodiment, the base 402 is made from a die graphite powder, which may be resin impregnated. As shown in FIG. 8, individual fins 404 are inserted into holes 408 located in a pair of parallel die plates 410 and 412. The holes 408 are shaped to match the fin contours, and their spacing and location are based on the desired heat transfer properties of the fin assembly. Graphite powder 414 is placed between the die plates, and this assembly is inserted into a die (not shown). The powder is then pressed to consolidate the powder to form base 402 surrounding the fins 404. The assembly is removed from the die, the die plates removed, and the short ends of the fins cut off flush with the base. A sheet 406, which preferably is unimpregnated, is placed on the bottom of the base 402. If the components of the graphite article are not resin impregnated, a thin layer of a resin, such as phenolic, acrylic or epoxy-based resin system can be interposed between the components. This assembly is then cured and the base 402, fins 404 and thermal interface 406 then become bonded together as shown in FIG. 9.

The axial finned heat sink 400 made by the second method will have all the advantages of that described for heat sink

300. In addition, the graphene layers in the base 402 will be oriented parallel to the plane of the base 402. This may provide improved heat transfer compared to the fin assembly 300 made with the rolled base.

Regardless of which construction is used for the heat sink, depending on the particular application in which heat sink is to be employed, it may also be desirable to provide a protective coating on the heat sink, to prevent graphite from flaking or breaking off and interfering with electronic component. Although not believed necessary in the vast majority of circumstances, such protective coatings can include conductive coatings, such as nickel plating.

As schematically shown in FIG. 9, either heat sink 300 or 400 can be mounted to an electronic component 450 by conventional means, such as by mounting directly to electronic component, using an adhesive, such as a pressure sensitive or thermally activated adhesive (something which the relatively low weight of graphite permits); mounting to a thermal interface such as 406, if present, such as by an adhesive; or mounting to the board or other object on which electronic circuit 450 is mounted, provided heat collection surface 406 of heat sink 400 is operatively connected to an external surface of the electronic component 450 (directly or through thermal interface 406). Electronic component 450 can comprise any electronic device or component that produces sufficient heat to interfere with the operation of electronic component 450 or the system of which electronic component 450 is an element, if not dissipated. Electronic component 450 can comprise a microprocessor or computer chip, an integrated circuit, control electronics for an optical device like a laser or a field-effect transistor (FET), or components thereof, or other like electronic element. Electronic component 450 includes at least one surface from which heat radiates and which can be used as a source of heat to be dissipated from electronic component 450.

The use of graphite to form heat sink 300 or 400 has many significant advantages. As discussed, the anisotropic nature of graphite allows the practitioner to direct the heat from external surface of electronic component 450 to the fins 404. Graphite materials have the further advantage of relatively low density, and thus relatively low weight. For instance, articles formed from exfoliated graphite particles generally have a density below about 1.3 g/cc. High density graphite articles have a density below about 1.9 g/cc. When compared with the density of copper—approximately 8.9 g/cc for pure copper—a graphite article of the same approximate size and volume of a copper article will weight significantly less.

The weight advantage of graphite over copper or other metals can be expressed in terms of their respective thermal conductivity. If one considers thermal conductivity per unit weight (sometimes referred to in the art as specific thermal conductivity, although the term may be a misnomer), the exfoliated graphite heat sinks of the present invention have a specific thermal conductivity in the direction of high conductivity of about 0.134 watts-meter$^2$ per kilogram-° C. (Wm$^2$/kg° C.) to about 0.184 Wm$^2$/kg° C., whereas copper heat sinks have a specific thermal conductivity of about 0.019 to about 0.051 Wm$^2$/kg° C. (for a specific thermal conductivity of 0.051, the heat sink would have to be formed of pure copper). Thus, per unit weight, graphite heat sinks can be far more effective at heat dissipation from electronic component, without the disadvantages of "loading" a circuit board or other component with excess weight. When the further advantages provided by the anisotropic nature of graphite are considered, heat sinks of the present invention are distinctly advantageous.

The methods of manufacture of the present invention may be summarized as:
(a) rolling an anisotropic flexible graphite sheet 312 between shaped rollers 314 and 316 to produce a plurality of parallel elongated continuous fin stock members 322 defined in the rolled sheet;
(b) cutting off a portion of the rolled sheet having a length 324 corresponding to a fin length;
(c) separating the fin stock members of the cut-off portion of the rolled sheet to create a plurality of separate elongated fins 304; and
(d) forming a generally planar base 302 bonded to the fins 304 so that the fins 304 extend from the base 302 in a direction generally perpendicular to the plane of the base.

More specifically, the method includes rolling the anisotropic flexible graphite sheet with a series of shaped rollers, so that the material between fin stock members is increasingly reduced as the sheet passes each shaped roller.

The method of FIGS. 1–7 also includes rolling another anisotropic flexible graphite sheet 326 between other shaped rollers 328 and 330, and cutting the other sheet 326 into a plurality of base pieces 308 having recesses 307. This aligns graphene layers of the anisotropic flexible graphite sheet in planes parallel to the length of the fins as the anisotropic flexible graphite sheet is rolled between the shaped rollers. Next, the method includes stacking the intermediate base pieces 308, along with end base pieces 306, so that the recesses 307 of adjacent base pieces combine to form base openings in which the fins 304 are received.

The assembly is then completed by clamping the stacked base pieces and fins, curing the clamped base pieces and fins, and thereby bonding the base pieces and fins together.

The method associated with FIGS. 8 and 9, can be described as including a step of die pressing a powdered graphite material 414 to form the base 402 about end portions of the fins, so that graphite layers of the base are aligned in planes perpendicular to lengths of the fins.

Radial Finned Heat Sink Construction

Radial finned heat sinks are used to cool a heat source such as an electronic component (like a chip assembly) such as those that are attached to printed circuit boards by ball grid arrays. Heat generated by the heat source is drawn into the heat sink by conduction and then carried out of the heat sink by convection through the fins. Multiple radial fins are used and they lie parallel to one another and to the surface of the heat source. The number of fins, their dimensions and spacing vary depending on cooling requirements. These heat sinks are conventionally made from aluminum alloys such as 6061 Aluminum. These alloys have a typical density of about 2.7 g/cm3 and exhibit a thermal conductivity which is isotropic and which is as high as about 221 W/m° C. Machining is required to manufacture these heat sinks and adds to their cost.

The radial heat sink is mounted above the heat source and can actually be attached to the heat source. If mechanical vibrations occur, the mass of the heat sink can cause strains that can lead to failures. Thus, reducing the mass of the heat sink will minimize such strains and improve the reliability of the assembly. A radial heat sink made from graphite sheet will have a mass substantially less than that of a comparable aluminum heat sink (on the order of 60% or less), which will reduce vibration induced strains.

A first embodiment of a radial fin heat sink of the present invention is shown in cross section in FIG. 12, and is identified by the numeral 500. Another embodiment of a radial finned heat sink in accordance with the present invention is shown in cross-section in FIG. 16, and is identified by the numeral 600.

Referring now to FIGS. 10–12, individual one piece fin members 502, shown in FIG. 10, which nest on each other, are pressed in a die. A separate end piece 504 shown in FIG. 11, is also die pressed. As shown in FIG. 12, any number of individual fin members 502a, 502b, 502c, etc. are then stacked together on top of the end piece 504. A sheet 506 of graphite can also be placed on the end of the end piece 504 to act as a thermal interface 506 to the chip itself. If the graphite article is not resin impregnated, a thin layer of a resin, such as phenolic, acrylic or epoxy-based resin system can be interposed between fin members 502a, 502b, 502c and end piece 504.

This assembly is clamped together under pressure and the epoxy resin is cured. The individual fin members 502, end piece 504 and thermal interface 506 then become bonded together. The end piece 504 may be machined as necessary (external threads may be cut into it for example) to mechanically attach this assembly to the heat source 550 in whatever manner is desired.

The radial finned heat sink assembly 500 can generally be described as including a base 504 constructed from graphite material, and a plurality of spaced parallel planar fin members 502 supported by the base 504. Each fin member 502 including a planar fin 510 of an anisotropic graphite material having graphene layers 508 aligned primarily with the plane of the fin 510, so that each fin 510 has a thermal conductivity in directions parallel to the plane of the fin, as indicated by arrows 511, substantially greater than a thermal conductivity perpendicular to the plane of the fin.

In FIGS. 10–12, each fin member 502 includes a core portion 503, the core portion 503 and the fin 510 of each fin member 502 preferably being integrally formed from a sheet of anisotropic flexible graphite material. The core portion 503 includes a core protrusion 505 on a first side and a complementary core recess 507 on a second side, so that the plurality of fin members 502 can be stacked with the protrusion 505 of one fin member received in the recess 507 of an adjacent fin member.

The base 504 includes a recess 509 defined therein complementary to the protrusions 505 of the fin members. The protrusion 505 of one of the fin members 502c adjacent the base 504 is received in the recess 509 of the base, so that the fin members 502 are stacked upon the base 504, with the core portions of the fin members defining a heat transfer path from the base.

In an alternate embodiment of the present invention, illustrated in FIGS. 13–16, individual radial fin members 602, with central holes 604, shown in FIG. 13, are pressed in a die from a flexible sheet material. A separate connector piece 606, shown in FIG. 14, is formed from isostatically compressed or die pressed flexible sheet material or powder material. The ends 608 and 610 of the connectors 606 are machined to allow them to interlock with the fin members 602 and with each other. A separate interlocking end piece or base 612, shown in FIG. 15, is also formed from compressed or die pressed flexible sheet material or powder material. The connectors 606 and end piece 612 have graphite layers 614 and 616 aligned so that the in-plane, high thermal conductivity direction is along the axis 618 of the connectors 606 and end piece 612 as indicated by arrows 619. This permits good heat transfer from the heat source 550 through the core of the heat sink and into the radial fins 602.

As shown in FIG. 16, any number of individual fins 602 and connectors 606 are then stacked together on top of the end piece 612. A sheet 620 of graphite can also be placed on the end of the end piece 612 to act as a thermal interface to the heat source 550 itself. If the graphite article is not resin impregnated, a thin layer of a resin, such as phenolic-, acrylic- or epoxy-based resin system can be interposed between the stacked elements. This assembly is clamped together under pressure and the resin is cured. The individual components and the graphite thermal interface then become bonded together. The end piece 612 may be machined as necessary to mechanically attach this assembly to the heat source in whatever manner is desired.

The heat sink 600 of FIG. 16 can be described as having its base 612 formed from a graphite material including graphene layers aligned primarily perpendicular to the planes of the fins, so that the base 612 and the connector members 606 define an anisotropic core having a direction of highest thermal conductivity in a direction perpendicular to the planes of the fins.

The heat sink 600 of FIG. 16 can also be described as a radially finned heat sink 600 for an electrical component 550, including a core having a base 612 for attachment to the electrical component, the core having a core axis 618, the core being constructed of a first graphite material having graphene layers aligned primarily parallel to the core axis 618, so that heat from the electrical component can be efficiently conducted away from the electrical component through the core in a direction parallel to the core axis 618. The heat sink 600 includes a plurality of spaced parallel fin plates 602 attached to and extending radially outward from the core, each fin plate being constructed of a graphite material having graphene layers aligned primarily parallel to the plane of the fin plate and perpendicular to the core axis, so that heat from the core can be efficiently transmitted radially outward along the plane of each fin plate. The core further includes a plurality of stacked core connector pieces 606, each core connector piece being constructed from a compressed graphite or a resin and graphite mixture. The core connector pieces 606 are stacked together, with one of the fin plates 602 sandwiched between each two adjacent connector pieces.

As schematically shown in FIGS. 12 and 16, either heat sink 500 or 600 can be mounted to an electronic component 550 by conventional means, such as by mounting directly to electronic component, using an adhesive, such as a pressure sensitive or thermally activated adhesive (something which the relatively low weight of graphite permits); mounting to a thermal interface such as 506 or 620, if present, such as by an adhesive; or mounting to the board or other object on which electronic circuit 550 is mounted, provided heat collection surface 506 or 620 of heat sink 500 or 600 is operatively connected to an external surface of the electronic component 550 (directly or through thermal interface 506 or 620). Electronic component 550 can comprise any electronic device or component that produces sufficient heat to interfere with the operation of electronic component 550 or the system of which electronic component 550 is an element, if not dissipated. Electronic component 550 can comprise a microprocessor or computer chip, an integrated circuit, control electronics for an optical device like a laser or a field-effect transistor (FET), or components thereof, or other like electronic element. Electronic component 550 includes at least one surface from which heat radiates and which can be used as a source of heat to be dissipated from electronic component 550. Also, as noted, the base may be threaded or the like to provide a mechanical connection to the electronic component 550.

The methods of constructing the heat sinks 500 and 600 can both be generally described as including steps of:

(a) die pressing a plurality of fin plate members from a sheet of graphite material having graphite layers aligned primarily in the plane of the sheet; and (b) assembling the fin plate members so that each fin plate member defines one of a plurality of spaced parallel planar fin plates extending radially outward in a plane normal to a central axis of the assembly.

In the method of manufacturing the heat sink 500, step (a) includes die pressing each fin plate member 502 to include an integral core portion having graphene layers aligned primarily in planes perpendicular to the central axis of the assembly. The method further includes die pressing a base 504 from a sheet of graphite material, and attaching the base 504 to the core portion of one of the fin plate members 502, the base 504 including graphite layers aligned primarily in planes perpendicular to the central axis of the assembly.

In the method of manufacturing the heat sink 600 of FIG. 16, step (a) includes die pressing the fin plate members 602 to have a central opening therethrough 604, and forming a plurality of core members 606 from graphite material, each core member 606 being shaped to be closely received within the central opening 604 of one of the fin plate members 602 and having graphite layers aligned primarily in planes parallel to the central axis 618 of the assembly. The fin plate members 602 and the core members 606 are assembled so that each core member 606 is sandwiched between two fin plate members 602.

Thus it is seen that the apparatus and methods of the present invention readily achieve the ends and advantages mentioned, as well as those inherent therein. While certain preferred embodiments of the invention have been illustrated and described for purposes of the present disclosure, numerous changes in parts and steps may be made by those skilled in the art, which changes are encompassed within the scope and spirit of the appended claims.

What is claimed is:

1. A method of manufacturing a heat sink assembly, comprising:

(a) forming a base from a first graphite material;

(b) forming a plurality of separate fins from a second graphite material comprising compressed particles of exfoliated graphite;

(c) assembling the base and the fins into a heat sink assembly; and (d) bonding the base and the plurality of fins together.

2. The method of claim 1, wherein the first and second graphite materials are each formed of graphite material comprising compressed particles of exfoliated graphite.

3. The method of claim 1, wherein the first and second graphite materials are both resin-impregnated graphite materials.

4. The method of claim 3, wherein:

in step (d), the bonding is achieved by clamping together the base and the fins, and curing the resin-impregnated graphite materials.

5. The method of claim 1, wherein:

in step (a) the base is formed by compressing a powered graphite material; and in step (b), the fins are formed from a sheet of flexible graphite material.

6. The method of claim 1, wherein in steps (a) and (b), both the base and the fins are formed from sheets of flexible graphite material.

* * * * *